United States Patent
Gehring

(10) Patent No.: US 11,936,496 B2
(45) Date of Patent: Mar. 19, 2024

(54) CAN TRANSMITTER WITH FAST CANL LOOP AND SWITCHED OUTPUT CASCODE

(71) Applicant: Microchip Technology Incorporated, Chandler, AZ (US)

(72) Inventor: Burkhard Gehring, Heilbronn (DE)

(73) Assignee: Microchip Technology Incorporated, Chandler, AZ (US)

( * ) Notice: Subject to any disclaimer, the term of this patent is extended or adjusted under 35 U.S.C. 154(b) by 171 days.

(21) Appl. No.: 17/548,666

(22) Filed: Dec. 13, 2021

(65) Prior Publication Data

US 2022/0209982 A1 Jun. 30, 2022

Related U.S. Application Data

(60) Provisional application No. 63/132,511, filed on Dec. 31, 2020.

(51) Int. Cl.
*H04L 12/40* (2006.01)
*H03K 17/687* (2006.01)

(52) U.S. Cl.
CPC ... *H04L 12/40006* (2013.01); *H03K 17/6872* (2013.01); *H04L 2012/40215* (2013.01)

(58) Field of Classification Search
CPC ......... H04L 12/40006; H04L 12/40013; H04L 2012/40215; H04L 25/0272; H03K 17/6872
See application file for complete search history.

(56) References Cited

U.S. PATENT DOCUMENTS

| | | | |
|---|---|---|---|
| 2016/0285653 A1* | 9/2016 | Walker | ............... H04L 12/40 |
| 2018/0343161 A1 | 11/2018 | Gehring | |
| 2022/0123958 A1* | 4/2022 | Repp | ............ H03K 17/6872 |

FOREIGN PATENT DOCUMENTS

| | | | | |
|---|---|---|---|---|
| EP | 3001564 A1 | 3/2016 | ............ | H03K 17/16 |
| EP | 3514958 A1 | 7/2019 | ......... | H03K 17/0814 |
| WO | 2018/217854 A1 | 11/2018 | ............ | H04L 12/40 |

OTHER PUBLICATIONS

International Search Report and Written Opinion, Application No. PCT/US2021/064786, 12 pages, dated Apr. 12, 2022.

* cited by examiner

*Primary Examiner* — David B Lugo
(74) *Attorney, Agent, or Firm* — SLAYDEN GRUBERT BEARD PLLC

(57) ABSTRACT

A controller area network (CAN) transmitter includes an output stage circuit including a CANH port and a CANL port, and an input stage circuit configured to receive an input signal. The input signal is configured to indicate whether the output stage circuit is to provide dominant or recessive states. The CAN transmitter includes a cascode circuit configured to provide output signals on the output stage circuit to provide dominant or recessive states based on the input signal. The CAN transmitter includes a switch circuit configured to, based upon the input signal, switch the cascode circuit on and off.

20 Claims, 3 Drawing Sheets

CAN TRANSMITTER WITH FAST CANL LOOP AND SWITCHED OUTPUT CASCODE

PRIORITY

This application claims priority to U.S. Provisional Patent Application No. 63/132,511 filed Dec. 31, 2020, the contents of which are hereby incorporated in their entirety.

FIELD OF THE INVENTION

The present disclosure relates to controller area network (CAN) control and, in particular, a CAN transmitter with a fast CANL control loop.

BACKGROUND

CAN is defined in the International Standards Organization (ISO) 11898 specification. ISO 11898 is a family of specifications in which ISO11898-1 covers a datalink layer while ISO 118980-2 and ISO 118980-3 cover physical layers of CAN. CAN is a robust communication protocol. A CAN node on a bus may detect errors in a received message and force the message to be destroyed and retransmitted. Accordingly, the message that a node does receive contains valid data. A CAN frame requires that every node acknowledge the message before it can be processed by that node. This acknowledge can only come after various error condition checks, such as a 15-bit cyclical redundancy check (CRC) on the message. If one CAN node finds an error with the message, the message is destroyed and retransmitted.

The CAN specification defines three different error states for a CAN node to be in, with each error state giving the CAN node different levels of bus access. The error states limit faulty nodes from taking down the CAN bus.

CAN includes serial communication in which all nodes on the CAN bus are attached to common connection using the same bitrate. CAN is message-based, rather than address-based. Thus, messages are not transmitted from one node to another node based on the address of a CAN node. Instead, a CAN node will broadcast its message to all nodes on the bus. The receiving node is required to determine whether it should act on that message. Single or multiple nodes may act on the same data. Accordingly, it is possible to add new nodes to a CAN bus without having to update the existing nodes with addressing information.

CAN allows for distributed control across a network because of the reliability of the data. This allows designers the of the network the flexibility to set up consumer-producer or peer-to-peer networks.

CAN network transmission may be performed using a differential pair of transmission lines—CANH and CANL. CAN may specify two logical states: recessive and dominant. During the recessive logical state, CANH and CANL may be approximately the same voltage, or within a specified tolerance of voltage from each other. During the dominant logical state, CANH and CANL may be separated by a voltage difference, VDiff. FIG. 1 illustrates an example differential bus timing diagram wherein CAN is used, including CANH, CANL, and VDiff.

In the recessive state (i.e., logic '1' on an input of a CAN transceiver or module) the differential voltage on CANH and CANL may be less than a minimum threshold. The minimum threshold may be determined by whether the state is on input, wherein the threshold is 0.5V, or the state is on output, wherein the threshold is 1.5V. In the dominant state (i.e., logic '0' on the input of a CAN transceiver or module), VDiff is greater than the minimum threshold. A dominant bit overdrives a recessive bit on the bus to achieve nondestructive bitwise arbitration.

Inventors of examples of the present disclosure have discovered that some implementations of CAN transceivers may experience excessive jitter or other noise, particularly regarding output of CANH and CANL signals. Furthermore, inventors of examples of the present disclosure have discovered that some implementations of CAN transceivers may experience such jitter in the transition output CAN signals from dominant to recessive, observable during a recessive pulse. Examples of the present disclosure may reduce such jitter by short-circuiting sources of cascode outputs in CAN transceivers to a cascode bias voltage, making the output values less sensitive to power transients.

DETAILED DESCRIPTION

Figure 2:
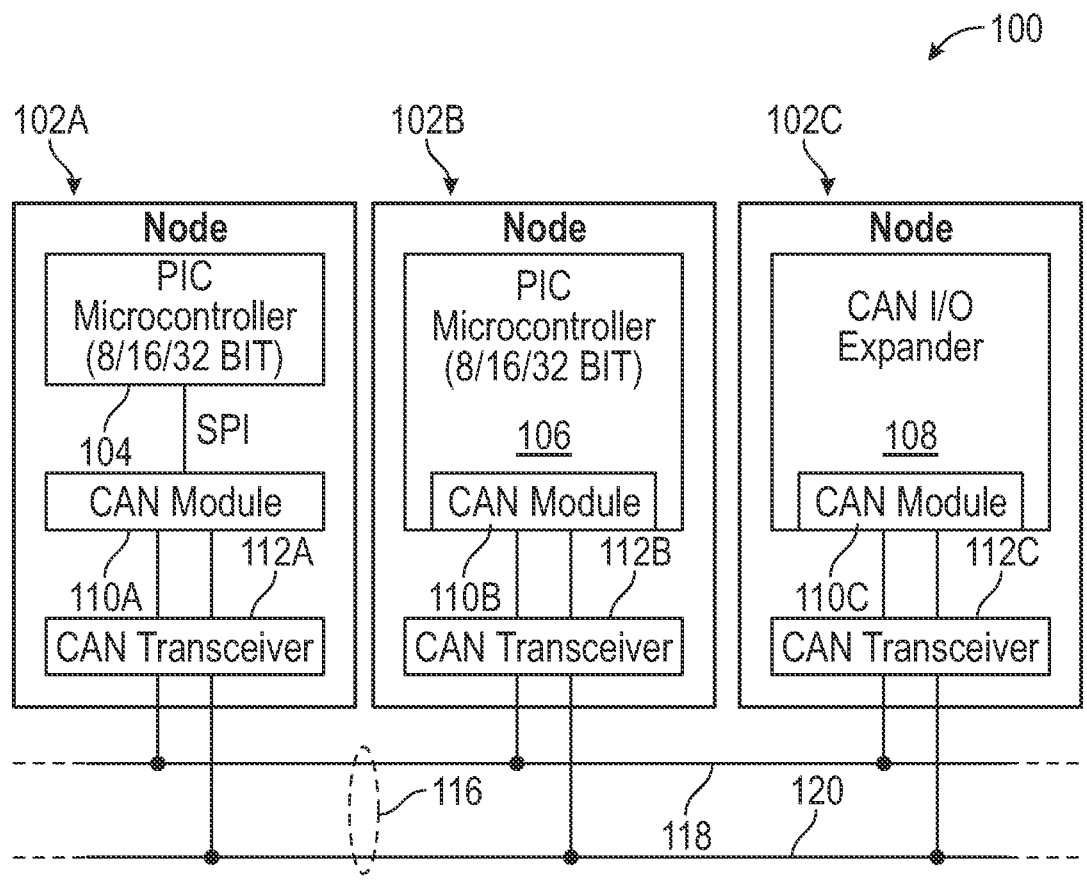
FIG. 2 is an illustration of an example CAN network, according to examples of the present disclosure.

FIG. 2 is an illustration of an example CAN network 100, according to examples of the present disclosure. Network 100 may include any suitable number and kind of CAN nodes 102. For example, network 100 may include nodes 102A, 102B, 102C. Nodes 102 may be configured to communicate with each other over a CAN bus 116. CAN bus 116 may be implemented with two lines. For example, CAN bus 116 may include a CANH line 120 and a CANL line 118.

Nodes 102 may be implemented in any suitable manner, such as by a computer, system on a chip, application specific integrated circuit, field programmable gate array, server, or any suitable electronic device. FIG. 2 illustrates example variations of CAN node implementations. For example, CAN node 102A may be implemented with a microcontroller 104. Microcontroller 104 may be implemented by, for example, an 8-bit, 16-bit, or 32-bit PIC microcontroller from the assignee of the present disclosure. Microcontroller 104 might not include an integrated CAN module. Accordingly, CAN node 102A might include a separately implemented CAN module 110A.

CAN modules 110 in network 100 may be configured to provide an interface between a CAN transceiver 112 and the rest of CAN node 102. CAN modules 110 and CAN transceivers 112 may be implemented by any suitable mechanism, such as by libraries, software stacks, functions, applications, drivers, digital logic, digital circuitry, analog circuitry, instructions for execution by a processor, or any suitable combination thereof. CAN modules 110 may make function calls of CAN transceivers 112 to send and receive data, or otherwise carry out the CAN protocol. Other elements of CAN nodes 102 may in turn make function calls of CAN modules 110. For example, software running on microcontroller 104 may communicate with other nodes 102 by making function calls to CAN module 110A, which in turn may make function calls to CAN transceiver 112A. CAN transceiver 112A may read and write data over CAN bus 116 to or from other CAN nodes 102.

CAN node 102A may include microcontroller 104 that does not include an integrated CAN module 110A. CAN node 102B may include a microcontroller 106 that includes an integrated CAN module 110B. CAN node 102C may be implemented as a CAN input/output (I/O) expander 108. CAN node 102C may provide I/O expansion for CAN network 100 without a microcontroller. CAN node 102C may include peripherals such as general-purpose JO, A2D, pulsed-width modulation, or other interfaces to send out periodic or event-based messages driven on thresholds. CAN I/O expander 108 may be implemented by any suitable combination of analog circuitry, digital circuitry, or instructions for execution by a processor.

A number of challenges may be encountered when implementing CAN network 100. For example, CAN system development may encounter electromagnetic compatibility (EMC) issues such as electromagnetic interference (EMI) while in an electromagnetic environment (EME). In CAN, differential communication must be required to work despite EMI. Such digital communication may include operations even over a large common mode range of +/−12V. Furthermore, such digital communication may include operating with up to 36 dBm (40V peak) injected radio frequency (RF) power. Furthermore, CAN must work in EMEs such as up to 55 dB µV (0.6 mV) common mode emissions up to 20 MHz, up to 15 dBµV (6 µV) common mode emissions at 75 MHz, and at a 2V differential signal amplitude. Furthermore, CANL and CANH currents may need to match each other with extremely accuracy, both at DC and transient.

A given CAN node 102 may exercise slow or fast control to generate CANH or CANL signals at a transceiver. The "fast" or "slow" aspect may refer to the speed of a control loop to generate an appropriate dominant or recessive signal. In particular, the "fast" or "slow" aspect of CANH or CANL control may refer to the slope of the change in signals between the recessive and the dominant states, or between the dominant and the recessive states. The slope may also be referred to as the slew rate of the signal transition. Faster rise and fall times may support higher bus rates and longer bus lengths in network 100.

Figure 3:
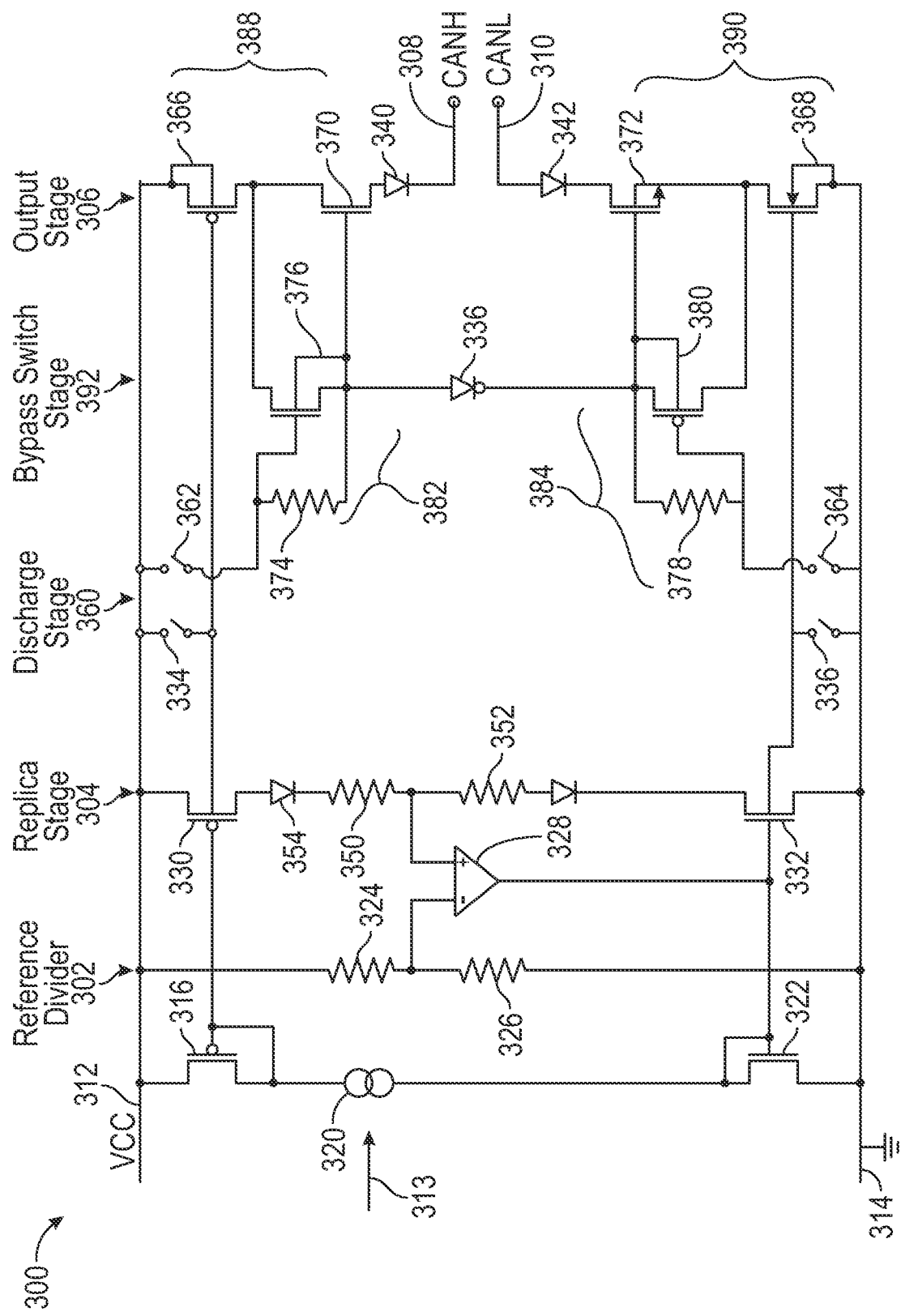
FIG. 3 is an illustration of an example CAN transceiver with fast CANL control loop and switched output cascode, according to examples of the present disclosure.

FIG. 3 illustrates a more detailed view of a CAN transceiver 300, according to examples of the present disclosure. Transceiver 300 may implement in part transceivers 112 of FIG. 2. Transceiver 300 may receive a signal 318 from other parts of the transceiver (not shown) or a CAN module 110. Signal 318 may be a stream of a bit pattern of values representing dominant or recessive states to be written to CAN network 100. The output dominant or recessive signal may be written to CANH 308 or CANL 310 pins. CANH and CANL 310 pins may be connected to CANH line 118 and CANL line 120, respectively. Transceiver 300 may be configured to perform faster rise and fall times for writing recessive or dominant states to CANH 308 and CANL 310 pins compared to other solutions. Moreover, in one example, transceiver 300 may be configured to switch CANH and CANL cascode output transistors therein to a high resistance when transitioning to a recessive state. This may be performed, as explained in more detail below, on the basis of and synchronously with a recessive signal to be transmitted. In a further example, during a recessive phase of operation, transceiver 300 may be configured to short-circuit sources of the output CANH and CANL cascode output transistors to a bias voltage of the respective cascode transistors, thus making the outputs high-resistance and insensitive to transient voltages. During a dominant phase, the cascode output transistors may be reactivated on the basis of and synchronously with a dominant signal to be transmitted.

In a first stage, an input stage circuit 398, transceiver 300 may include a current source 320 connected to signal 318. Signal 318 may be configured to drive output of current source 320 according to the received bit pattern. Current source 320 may be implemented in any suitable manner. In one example, current source 320 may be a floating current source. Current source 320 may be a programmable or adjustable current source based upon the input of signal 318. An injection bit pattern may be provided from into current source 320 into current mirrors. The current mirrors may include a replica stage 304 and an output stage 306.

VCC 312 may be connected to transceiver 300. Ground 314 may be connected to transceiver 300. VCC 312 may be connected to the source of a transistor 316. Transistor 316 may be a p-type metal-oxide-semiconductor (PMOS) transistor. Current source 320 may be connected to the drain of transistor 316. Current source 320 may be connected to the source of another transistor 322. Transistor 322 may be an n-type metal-oxide-semiconductor (NMOS) transistor. Furthermore, current source 320 may be connected to the gate of transistor 322. The drain of transistor 322 may be connected to ground 314.

Transceiver 300 may include a replica stage 304. Replica stage 304 may include a transistor 330 connected to VCC 312. Transistor 330 may be a PMOS transistor. Transistor 330 may be connected to VCC 312 at its source. The gate of transistor 330 may be connected to the gate of transistor 316. The drain of transistor 330 may be connected to a diode 354. Diode 354 may be connected to a resistor 350, which may be connected to another resistor 352. Resistor 352 may be connected to a diode 356. Diode 356 may be connected to the source of a transistor 332. The drain of transistor 332 may be connected to ground 314. Diodes 356, 354 may be freewheeling diodes. The gate of transistor 332 may be connected to the gate of transistor 322. Transistor 332 may be an NMOS transistor.

Transceiver 306 may include an output stage 306. Output stage 306 may include two output cascode circuits 388, 390. In one example, each of cascode circuits 388, 390 may be implemented by a MOS transistor with a lateral double-diffused (LD) MOS transistor. For example, cascode circuit 388 may include a PMOS transistor 366 and a LDPMOS transistor 370. Cascode circuit 390 may include an NMOS transistor 372 and an LDNMOS transistor 368. Transistors 370, 372 may be referred to as cascode transistors.

Transistor 366 may be connected at its source to VCC 312. Transistor 366 may be connected at its gate to the gate of transistor 330 and the gate of transistor 316. Transistor 366 may be connected at it drain to a source of transistor 370. Transistor 370 may be connected at its drain to a diode 340. Diode 340 may be connected to CANH pin 308. CANL pin 310 may be connected to a diode 342. Diode 342 may be connected to the source of transistor 372. The drain of transistor 372 may be connected to the source of transistor 368. The gate of transistor 368 may be connected to the gate of transistor 332 and the gate of transistor 322. The drain of transistor 368 may be connected to ground 314. Diodes 340, 342 may be freewheeling diodes. Diodes 340, 342 may be used for electrostatic discharge protection and for reverse protection.

In one example, transceiver 306 may include a control amplifier 328. Output of amplifier 328 may be connected to the gate of transistor 368. Moreover, output of amplifier 328 may be connected to the gates of transistors 322, 332. Amplifier 328 may be implemented by, for example, a 1-stage, 2-stage, or 3-stage operational amplifier. In a further example, amplifier 328 may receive inputs from a reference divider 302 and from replica stage 304. For example, amplifier 328 may receive a negated input from reference divider 302 and a positive input from replica stage 304, or vice-versa.

Reference divider 302 may be connected to VCC 312. Reference divider 302 may include two resistors 324, 326. Resistor 326 may be connected to ground 314. The values of resistors 324, 326 may be the same. Reference divider 302 may provide a reference voltage to amplifier 328 from a node between resistors 324, 326.

Input from replica stage 304 to amplifier 328 may be provided from a node between resistors 350, 352. The value of resistors 350, 352 may be the same. Any suitable value of resistance may be used in resistors 324, 326, 350, 352. Reference divider 302 may be a total of 110 ohms. Resistors 350, 352 may be, for example, six times higher than an output CAN bus resistor. Such a CAN bus resistor may be, for example, 60 ohms.

Transceiver 300 may include a discharge stage 360. For example, a switch 334 may be provided between VCC 312 and the gates of transistors 366, 330, 316. Switch 334 may be optional. In another example, a switch 336 may be provided between ground 314 and the gates of transistors 368, 332, 322. Switch 336 may be optional, as control provided by transistors in FIG. 3 may perform an equivalent function. Switches 334, 336 may be driven by bit pattern 318. Hard switching may use current sources. In contrast, switches 334, 336 may be driven with bit pattern 318.

Replica stage 304 may be a fraction of the size or of the current of output stage 306. The fraction may be, for example, 1/10 to 1/3 of the current of output stage 306. In one example, 1/6 of the output state current may be used. Replica stage 304 may be configured to produce a replica signal. The replica signal may detect the difference in CANH and CANL current changes. The replica signal may be an estimate of the common mode signal that is to be applied to the CAN bus over CANH pin 308 and CANL pin 310. The replica signal may be provided to amplifier 328. Amplifier 328 may in turn be configured to maintain the replica signal at a desired level. The desired level may be expressed by a reference voltage provided by reference divider 302. In particular, amplifier 328 may be configured to maintain the replica signal by controlling the signal on CANL pin 310. The replica signal generated by replica stage 304 may be controlled by applying the output of amplifier 328 to the gate of transistor 332.

Replica stage 304 may be implanted as a reduced size (such as 1-30%) of output stage 306. Replica stage 304 may include a model of the bus load on CAN network 100. Such a model may be implemented by, for example, resistors 326, 330. The center tap of resistors 326, 330 may be used for input or feedback to amplifier 328. Amplifier 328 may control the gate voltage of transistor 368. Transceiver 300 may thus use active feed-forward for compensating and stabilizing the control loop to generate CANL pin 310 signals. Transceiver 300 may use a constant voltage, such as 2.5V, as a target for replica voltage. Transceiver 300 may use a certain ratio, such as 50%, as a target for replica voltage. This may be implemented by reference divider 302.

Transceiver 300 may provide advantages over slower CANH and CANL control. Transceiver 300, by using a control circuit including amplifier 328 and its connections shown in FIG. 3, may provide advantages over use of hard switching to generate CANH and CANL signals. Without hard switching, high frequency emissions may be reduced.

Other solutions may use a switch to switch between dominant and recessive generation of signals for CANH and CANL.

During CANL control, slow CANH control may be deactivated. In one example, only the CANL signals may be controlled (using cascode circuit 390), as opposed to controlling both NMOS and PMOS devices of cascode circuits 390, 388 by amplifier 328. This may result from PMOS mirrors operating slower than NMOS mirrors. Accordingly, the capacitance of NMOS transistors in cascode circuit 390, which is three times lower than that of capacitance of PMOS transistors in cascode circuit 388, may yield faster control. In one example, the control loop may be biased at all times.

In one example, transceiver 300 may include a bypass switch stage 392. Bypass switch stage 392 may be connected to or part of discharge stage 360. Bypass switch stage 392 may include two switch circuits 382, 384 connected in series between VCC 312 and ground 314. Moreover, switch circuits 382, 384 may be separated by a diode 386. In addition, a path formed by switch circuits 382, 384 may be selectively enabled through any suitable mechanism, such as by switches 362, 364. Switches 362, 364 may be configured to connect switch circuits 382, 384, to the power rails of VCC 312 and ground 314, and so enable the operation of switch circuits 382, 384. Moreover, switches 362, 364 may be driven by signal 318.

Each of switch circuits 382, 384 may be implemented in any suitable manner. In one example, each of switch circuits 382, 384 may be implemented by a resistor in parallel with a switch. For example, switch circuit 382 may include a resistor 374 connected across a transistor 376. A switch circuit 384 may include a resistor 378 connected across a transistor 380. The resistance values of resistors 374, 378 may be closely matched.

Transistor 376 may be implemented in any suitable manner, such as by an NMOS transistor. Resistor 374 may be connected across the gate and drain terminals of transistor 376. Resistor 374 and the gate of transistor 376 may be connected to switch 362. The body and drain of transistor 376 may be connected together. The source of transistor 376 may be connected to cascode circuit 388. In particular, the source of transistor 376 may be connected to a midpoint between transistor 366 and transistor 370. The drain of transistor 376 may be connected to cascode circuit 388. In particular, the drain of transistor 376 may be connected to the gate of transistor 370.

Transistor 380 may be implemented in any suitable manner, such as by a PMOS transistor. Resistor 378 may be connected across the gate and drain terminals of transistor 380. Resistor 378 and the gate of transistor 380 may be connected to switch 364. The source and body of transistor 380 may be connected together. The drain of transistor 380 may be connected to cascode circuit 390. In particular, the drain of transistor 380 may be connected to a midpoint between transistor 368 and transistor 372. The source of transistor 380 may be connected to cascode circuit 390. In particular, the drain of transistor 376 may be connected to the gate of transistor 372.

Transceiver 300 may be configured to operate on a generation of a push-pull control current from input of signal 318 and VCC 312 that energize both resistors 374, 378 to control switch circuits 382, 384 to switch cascode circuits 388, 390 on and off. This may be performed by operation of switches 362, 364 which may act as controlled current sources. Switch 362 may cause current to be supplied and switch 364 may cause current to be received. This may cause a symmetrical voltage to drop across resistors in the current path, such as resistors 374, 378, and thus a synchronous switching of switch circuits 382, 384.

In one example, switch circuits 382, 384 may be configured to switch cascode transistors 370, 372, respectively, to a high input impedance. This may be performed during a recessive state. In particular, switch circuits 382, 384 may be configured to switch cascode transistors 370, 372 to an off state, causing such a high input impedance. Switch circuits 382, 384 may be configured to switch cascode transistors 370, 372 to an on state during a dominant mode.

Switch circuits 382, 384 may be configured to so switch cascode transistors 370, 372 based upon any suitable criteria. In a further example, switch circuits 382, 384 may be configured to switch cascode circuits 388, 390 to a high resistance on the basis of output of CANL 310 and CANH 308 being driven to the recessive state based on signal 318.

Switch circuits 382, 384 may be configured switch cascode transistors 370, 372 on and off in any suitable manner. For example, during the recessive state, switches 362, 364 may be closed, energizing resistors 374, 378. In such a state, resistors 374, 378 may be connected in series. The voltage drop across each of resistors 374, 378 may be the same. Moreover, the voltage drop across each of resistors 374, 378 may equal or exceed the necessary Vgd voltage at the respective gates of transistors 376, 380 to activate such transistors 376, 380, which may in turn off respective cascode circuits 388, 390, and in particular, respective transistors 370, 372. This may, in effect, short-circuit respective cascode transistors 370, 372. causing current to flow from VCC 312 through transistor 366, transistor 376, transistor 380, and transistor 368 to ground, rather than to CANH port 308 or CANL port 310. This path may be a short-circuit of cascode transistors 370, 372, thus making the outputs to CANH port 308 and CANL port 310 have a high impedance that is insensitive to transient voltages.

During the dominant state, switches 362, 364 may be open, causing no voltage drop across resistors 374, 378. Switch circuits 382, 384 might be off, thus activating transistors 370, 372, allowing current signals to reach CANH port 308 or CANL port 310.

Figure 1:
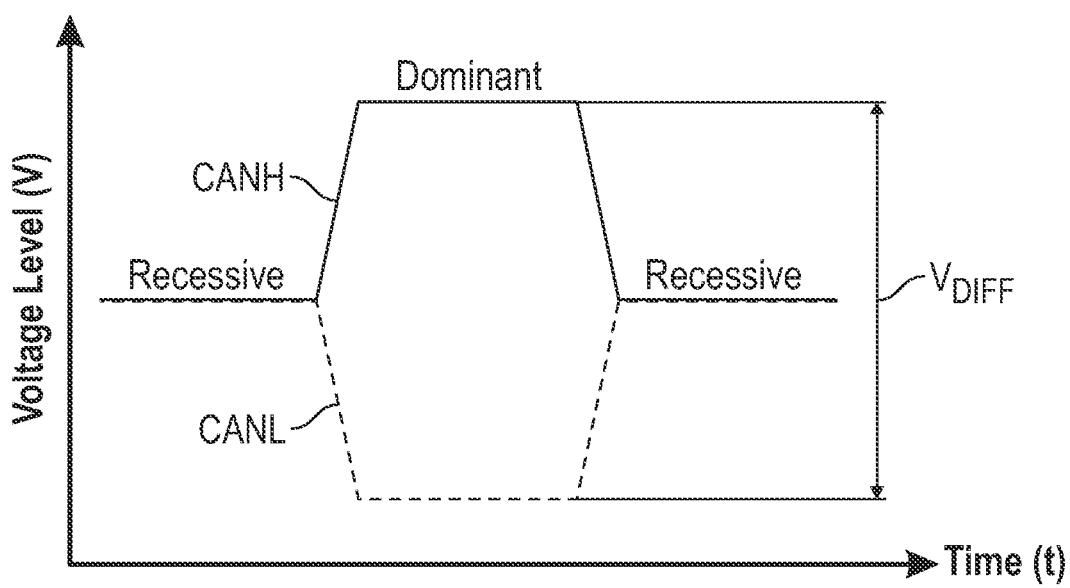
FIG. 1 is an illustration of example CAN signaling.

A terminating resistor (not shown) may be used to interface CAN bus 116 to transceiver 300. The terminating resistor may be, for example, 60 ohms. If the resistor is energized, it may reflect the dominant state shown in FIG. 1. Otherwise, the resistor may reflect the recessive state. Such a resistor may be placed between the terminal pins CANH and CANL.

Figure 4:
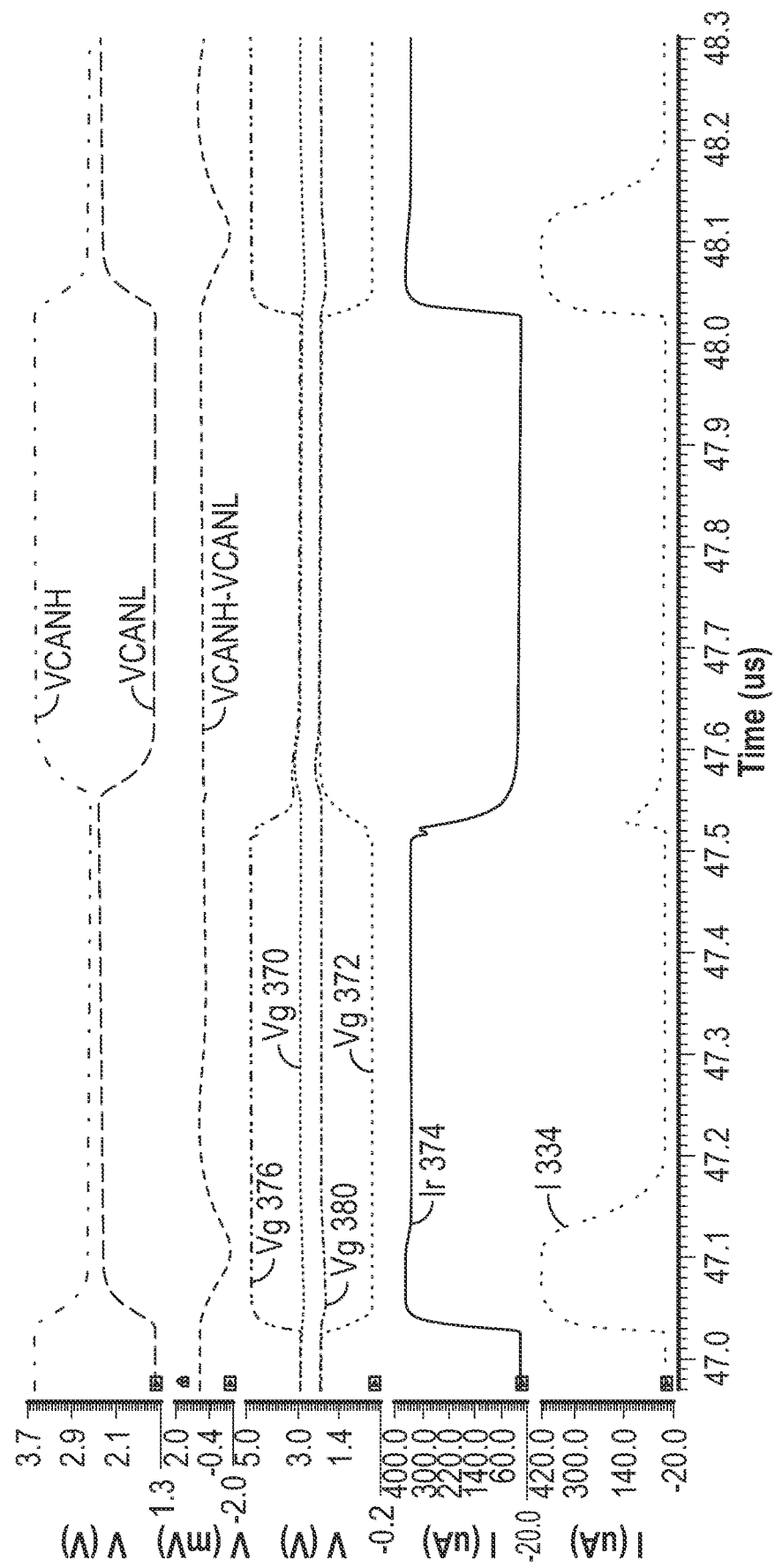
FIG. 4 is a timing diagram of various signals, inputs, and outputs of the CAN transceiver, according to examples of the present disclosure.

FIG. 4 is an illustration of timing diagrams of various signals of transceiver 300, illustrating operation of transceiver 300, according to examples of the present disclosure. Illustrated are VCANH, VCANL, a difference between VCANH and VCANL, a voltage at the gate (Vg) of transistor 376, Vg of transistor 370, Vg of transistor 372, Vg of transistor 380, current passing through resistor 374 (Ir), and current passing through switch 334 (I).

Examples of the present disclosure may include a CAN transmitter. The CAN transmitter may be included in any suitable context or device, such as a microcontroller or transceiver. Although referred to as a CAN transmitter, the CAN transmitter may be implemented with additional components to make a CAN transceiver.

The CAN transmitter may include an output stage circuit including a CANH port and a CANL port. The CANH port and CANL port may be configured to provide output signals to other CAN devices. The CAN transmitter may include an input stage circuit configured to receive an input signal. The input signal may be configured to indicate whether the output stage circuit is to provide dominant or recessive states. The input signal may include, for example, a bit code or series of bits, each bit indicating whether for a period of time or clock cycles that the output stage circuit is to provide dominant or recessive states. The CAN transmitter may include a first cascode circuit configured to provide output signals on the output stage circuit to provide dominant or recessive states based on the input signal. The CAN transmitter may include a first switch circuit configured to, based upon the input signal, switch the first cascode circuit on and off.

In combination with any of the above examples, the first switch circuit may be configured to switch the first cascode circuit off to cause current to flow through the CAN transmitter and avoid output on the CANH port or CANL port.

In combination with any of the above examples, the first switch circuit may include a resistor and a switch circuit transistor. The resistor may be configured to, based on the input signal, provide a voltage drop across a gate and a drain of the switch circuit transistor sufficient to turn on the switch circuit transistor. The switch circuit transistor may be configured to turn the first cascode circuit on or off.

In combination with any of the above examples, when turned on, the switch circuit transistor may be configured to switch the first cascode circuit off.

In combination with any of the above examples, the CAN transmitter may further include an input switch configured to be controlled by the input signal and to provide power for the voltage drop of the resistor.

In combination with any of the above examples, the first switch circuit may be configured to switch the first cascode circuit on based on an indication from the input signal to provide a recessive state.

In combination with any of the above examples, the first switch circuit may be configured to switch the first cascode circuit off based on an indication from the input signal to provide a dominant state.

In combination with any of the above examples, the first cascode circuit may include a first transistor and a second transistor. The first transistor may be configured to selectively provide input power to the second transistor and to be selectively controlled by the input signal. The first switch circuit may be configured to turn off the second transistor to switch the first cascode circuit off.

In combination with any of the above examples, the first switch circuit may be further configured to turn off the second transistor to cause current to flow through the CAN transmitter instead of the second transistor.

In combination with any of the above examples, the CAN transmitter may further include a second cascode circuit configured to provide output signals on the output stage circuit to provide dominant or recessive states based on the input signal. The CAN transmitter may further include a second switch circuit configured to, based upon the input signal, switch the second cascode circuit on and off.

In combination with any of the above examples, the first switch circuit and the second switch circuit may be configured to, based upon an indication from the input signal to output a recessive state, switch off the first cascode circuit and the second cascode circuit to short-circuit sources of the first cascode circuit and the second cascode circuit.

In combination with any of the above examples, the first switch circuit may be configured to cause a high input impedance to an output port of the first cascode circuit when the first cascode circuit is switched off.

Those in the art will understand that a number of variations may be made in the disclosed examples, all without departing from the spirit and scope of the invention, which is defined solely by the appended claims. The components of the system described above may be implemented in digital circuitry, analog circuitry, instructions for execution by a processor, or any suitable combination thereof.

What is claimed is:

1. A controller area network (CAN) transmitter, comprising:
    an output stage circuit including a CANH port and a CANL port;
    an input stage circuit to receive an input signal, the input signal to indicate whether the output stage circuit is to provide dominant or recessive states;
    a first cascode circuit to provide output signals on the output stage circuit to provide dominant or recessive states based on the input signal;
    a first switch circuit to, based upon the input signal, switch the first cascode circuit on and off;
    a second cascode circuit configured to provide output signals on the output stage circuit to provide dominant or recessive states based on the input signal; and
    a second switch circuit configured to, based upon the input signal, switch the second cascode circuit on and off;
    wherein the first switch circuit and second switch circuit are to, based upon an indication from the input signal to output a recessive state, switch off the first cascode circuit and the second cascode circuit to short-circuit sources of the first cascode circuit and the second cascode circuit.

2. The CAN transmitter of claim 1, wherein the first switch circuit is to switch the first cascode circuit off to cause current to flow through the CAN transmitter and avoid output on the CANH port or CANL port.

3. A controller area network (CAN) transmitter, comprising:
    an output stage circuit including a CANH port and a CANL port;
    an input stage circuit to receive an input signal, the input signal to indicate whether the output stage circuit is to provide dominant or recessive states;
    a first cascode circuit to provide output signals on the output stage circuit to provide dominant or recessive states based on the input signal;
    a first switch circuit to, based upon the input signal, switch the first cascode circuit on and off;
    wherein:
        the first switch circuit includes a resistor and a switch circuit transistor; and
        based on the input signal, the resistor is to provide a voltage drop across a gate and a drain of the switch circuit transistor sufficient to turn on the switch circuit transistor.

4. The CAN transmitter of claim 3, wherein when turned on, the switch circuit transistor is to switch the first cascode circuit off.

5. The CAN transmitter of claim 3, comprising an input switch to be controlled by the input signal and to provide power for the voltage drop of the resistor.

6. The CAN transmitter of claim 1, wherein the first switch circuit is to switch the first cascode circuit on based on an indication from the input signal to provide a recessive state.

7. The CAN transmitter of claim 1, wherein the first switch circuit is to switch the first cascode circuit off based on an indication from the input signal to provide a dominant state.

8. The CAN transmitter of claim 1, wherein:
    the first cascode circuit includes a first transistor and a second transistor;
    the first transistor is to selectively provide input power to the second transistor and to be selectively controlled by the input signal; and
    the first switch circuit is to turn off the second transistor to switch the first cascode circuit off.

9. The CAN transmitter of claim 8, wherein the first switch circuit is to turn off the second transistor to cause current to flow through the CAN transmitter instead of the second transistor.

10. The CAN transmitter of claim 1, wherein the first switch circuit is to cause a high input impedance to an output port of the first cascode circuit when the first cascode circuit is switched off.

11. A method of operating a controller area network (CAN) transmitter, comprising:
    at an input stage circuit, receiving an input signal, the input signal to indicate whether an output stage circuit is to provide dominant or recessive states in CANH and CANL outputs from a CANH port and a CANL port;
    at a first cascode circuit, providing output signals on the output stage circuit to provide dominant or recessive states based on the input signal;
    at a first switch circuit, switching the first cascode circuit on and off; and
    providing a voltage drop across a gate and a drain of a switch circuit transistor of the first switch circuit, the voltage drop sufficient to turn on the switch circuit transistor.

12. The method of claim 11, comprising switching switch the first cascode circuit off to cause current to flow through the CAN transmitter and avoid output on the CANH port or CANL port.

13. The method of claim 11, comprising switching the first cascode circuit off when the switch circuit transistor is turned on.

14. The method of claim 11, comprising controlling an input switch with the input signal and, with the input switch, providing power for the voltage drop of the resistor.

15. The method of claim 11, comprising, with the first switch, switching the first cascode circuit on based on an indication from the input signal to provide a recessive state.

16. The method of claim 11, comprising, with the first switch, switching the first cascode circuit off based on an indication from the input signal to provide a dominant state.

17. The method of claim 11, wherein the first cascode circuit includes a first transistor and a second transistor, the method further comprising:
    selectively controlling the first transistor with the input signal to selectively provide input power to the second transistor; and
    with the first switch circuit, turning off the second transistor to switch the first cascode circuit off.

18. The method of claim 17, comprising, with the first switch circuit, turning off the second transistor to cause current to flow through the CAN transmitter instead of the second transistor.

19. A method of operating a controller area network (CAN) transmitter, comprising:
    at an input stage circuit, receiving an input signal, the input signal to indicate whether an output stage circuit is to provide dominant or recessive states in CANH and CANL outputs from a CANH port and a CANL port;

at a first cascode circuit, providing output signals on the output stage circuit to provide dominant or recessive states based on the input signal;
at a first switch circuit, switching the first cascode circuit on and off;
with a second cascode circuit, providing output signals on the output stage circuit to provide dominant or recessive states based on the input signal;
with a second switch circuit, based upon the input signal, switching the second cascode circuit on and off;
with the first switch circuit and second switch circuit, based upon an indication from the input signal to output a recessive state, switching off the first cascode circuit and the second cascode circuit to short-circuit sources of the first cascode circuit and the second cascode circuit.

20. The method of claim 11, comprising, with the first switch circuit, causing a high input impedance to an output port of the first cascode circuit when the first cascode circuit is switched off.

* * * * *